US007112525B1

(12) United States Patent
Bhansali et al.

(10) Patent No.: US 7,112,525 B1
(45) Date of Patent: Sep. 26, 2006

(54) METHOD FOR THE ASSEMBLY OF NANOWIRE INTERCONNECTS

(75) Inventors: Shekhar Bhansali, Tampa, FL (US); Shyam Aravamudhan, Tampa, FL (US); Kevin Luongo, St. Petersburg, FL (US); Sunny Kedia, Tampa, FL (US)

(73) Assignee: University of South Florida, Tampa, FL (US)

( * ) Notice: Subject to any disclaimer, the term of this patent is extended or adjusted under 35 U.S.C. 154(b) by 0 days.

(21) Appl. No.: 10/905,243

(22) Filed: Dec. 22, 2004

Related U.S. Application Data

(60) Provisional application No. 60/481,824, filed on Dec. 22, 2003.

(51) Int. Cl.
*H01L 21/4763* (2006.01)

(52) U.S. Cl. ........................ 438/618; 977/721

(58) Field of Classification Search ................ 257/784; 438/55, 98, 455, 459, 466, 584, 598, 618; 977/700, 701, 720, 721
See application file for complete search history.

(56) References Cited

U.S. PATENT DOCUMENTS

| 6,359,288 | B1 | 3/2002 | Ying et al. | |
|---|---|---|---|---|
| 6,383,923 | B1* | 5/2002 | Brown et al. | 438/666 |
| 2002/0172820 | A1* | 11/2002 | Majumdar et al. | 428/357 |
| 2004/0206448 | A1* | 10/2004 | Dubrow | 156/276 |
| 2005/0064185 | A1* | 3/2005 | Buretea et al. | 428/364 |

FOREIGN PATENT DOCUMENTS

WO    WO 02/17362 A2 *   2/2002

OTHER PUBLICATIONS

Canham, Leigh, ed. Properties of Porous Silicon. Instituion of Electrical Engineers, 1997.*

S. Armbruster et. al.A Novel Micromaching Process for the Fabrication of Mono-crystalline Si-Membranes using Porous Silicon. The 12$^{th}$ International Conference on Solid State Sensors, Actuators and Microsystems.*

Lehmann, Volker. Electrochemistry of Silicon: Instumation, Science, Materils and Applications. Wiley-VCH Verlag GrmbH, 2002. Chapther 6.*

Nalwa, H.S., ed. Encyclopedia of nanoscience and Nanotechnology. vol. X: pp. 1-18.*

Al-Sarawi et al., A Review of 3-D Packaging Technology, IEEE Transactions on Components, Packaging, and Manufacturing Technology, Feb. 1998, p. 2-14, Part B vol. 21 No. 1.

Cardot et al., Electrical Through-Wafer Interconnects for Silicon-Based MEMS Application to Electromechanical Sensors, CSE Scientific and Technical Report 2003, p. 69.

(Continued)

*Primary Examiner*—Brook Kebede
(74) *Attorney, Agent, or Firm*—Molly L. Sauter; Smith & Hopen, P.A.

(57) ABSTRACT

The present invention provides a method for the synthesis of nanowires in a silicon nanoporous template by electrodeposition and a novel technique for the integration of nanowires to transduction surfaces. In accordance with the present invention, a method for the fabrication of nanowire interconnects is provided. The method includes the steps of fabricating substantially vertical nanowires in a selectively passivated nanoporous silicon template, backetching the silicon template to expose the nanowires, eutectically bonding the exposed nanowires to a receiving silicon wafer, and etching the silicon template to produce substantially freestanding nanowire interconnects in contact with the receiving silicon wafer.

26 Claims, 7 Drawing Sheets

OTHER PUBLICATIONS

Linder et al., Fabrication Technology for Wafer Through-Hole Interconnections and Three-Dimensional Stacks of Chips and Wafers, IEEE, 1994, p. 349-354.

Mehra et al., Through-Wafer Electrical Interconnect for Multilevel Microelectromechanical System Devices, J. Vac. Sci. Technology, Sep./Oct. 2000, p. 2583-2589, B 18(5).

Nguyen et al., Through-Wafer Copper Electroplating for Three-Dimensional Interconnects, Journal of Micromechanics and Microengineering, 2002, p. 395-399, vol 12.

Ok et al., High Density, High Aspect Ratio Through-Wafer Electrical Interconnect Vias for MEMS Packaging, IEEE Transactions on Advanced Packaging, Aug. 2003, p. 302-309, 26(3).

* cited by examiner

60

75

METHOD FOR THE ASSEMBLY OF NANOWIRE INTERCONNECTS

CROSS REFERENCE TO RELATED APPLICATION

This application claims priority to U.S. Provisional Patent Application No. 60/481,824 entitled: "Nanowire Assembly for Nanoscale Interconnects," filed by the same inventors on Dec. 22, 2003.

BACKGROUND OF INVENTION

Sensors based on metallic nanowires, nanorods and nanoparticles are increasingly being investigated because of unique electronic, optical, biological and magnetic sensing properties that these nanostructures offer. These properties aid in the development of reliable, improved and fast detection techniques for sensors. Templated synthesis of these nanostructures through plating techniques is increasingly being accepted as an elegant alternative to sophisticated methods such as molecular beam epitaxy and e-beam lithography. The advantages of the template method as known in the art are: (a) batch fabrication ability (b) accurate control of the diameter of the pores through controlled pore growth, (c) control of the pore morphology and (d) control of composition through plating solutions.

It is generally known in the art to synthesize nanowires using electroplating, which is generally done by plating the desired material within cylindrical or monodispersed pores in nanoporous templates. Materials known in the art for use as nanoporous templates include alumite membranes (anodized aluminum films) or track-etched polymer membranes (polycarbonate) or mesoporous silica. Also known in the art is deep reactive ion etching (DRIE) of silicon to realize vertical interconnects. These methods of nanowire synthesis as known in the art have provided nanowires and through-wafer vertical interconnects with aspect ratios (height:width) at a maximum of 10:1. However, higher aspect ratios are required to realize the high-density circuits useful in MEMS/NEMS devices.

Advancements in the field of System-On-Chip (SoC) and 3-D integrated circuits demands an efficient and optimized interconnect scheme. Stray effects are minimized when the electronic circuitry is in close proximity to the transducer. Designing an interconnect scheme to obtain high a fill factor and low loss calls for a vertical interconnect strategy. As devices continue to be scaled down, the contact pad area also shrinks requiring further reductions in the interconnect dimensions.

Synthesized nanowires are used to provide improved packaging and interconnect schemes for integrated circuits and sensors. In particular, the fabrication of through-wafer nanowires to provide vertical interconnects in 3D devices provides for the realization of high-density circuits and systems. High-density arrays of vertical interconnects are of great interest in MEMS/NEMS packaging.

In addition to the use of nanowires for packaging, a major impediment in using nanowires for field deployable systems has been the difficulty inherent in handling the nanowires and functionalization of the sensing elements with nanowires. Fundamentally, fabricating sensing nanowires is a two-step process where (1) the nanowires are bound to the transductor surface and (2) the nanowires are functionalized for the target of interest. These steps may be performed in any order and non-specific binding of wires to targets is a major issue of concern in this process.

Accordingly, what is needed in the art is an improved method for the synthesis and assembly of ultra-high aspect ratio metallic nanowires to be deployed as interconnects and sensing elements thereby providing a generic, high density, reconfigurable and low cost alternative to conventional packaging schemes.

SUMMARY OF INVENTION

The present invention provides a method for the synthesis of nanowires in a silicon nanoporous template by electrodeposition and a novel technique for the integration of nanowires to transduction surfaces.

In accordance with the present invention, a method for the fabrication of nanowire interconnects is provided. The method includes the steps of fabricating substantially vertical nanowires in a selectively passivated nanoporous silicon template, backetching the silicon template to expose the nanowires, eutectically bonding the exposed nanowires to a receiving silicon wafer, and etching the silicon template to produce substantially freestanding nanowire interconnects in contact with the receiving silicon wafer.

In a particular embodiment, the substantially vertical nanowires are fabricated in a selectively passivated nanoporous silicon template by providing a doped silicon template, oxidizing at least a portion of a front surface of the silicon template, patterning the front surface of the oxidized silicon template with a desired pattern, diffusing the silicon substrate with a dopant opposite to the dopant of the template, resulting in diffused regions and undiffused regions controlled by the desired pattern, depositing and patterning a layer to protect the diffused regions, electrochemically etching the substrate to fabricate substantially vertical nanopores in the undiffused regions of the silicon template, evaporating a thin layer of conductive material on a back surface of the silicon substrate to provide a uniform contact for etching, exposing the fabricated nanopores to an electrochemical etching to establish through-pores in the template, and depositing conductive material into the through pores of the template by electrochemical deposition to fabricate substantially vertical nanowires in the silicon template.

In an additional embodiment, the silicon template may be subjected to critical point drying following the electrochemical etching.

It is within the scope of the present invention to complete the electrochemically etching of the silicon template utilizing a plurality of methods as are known in the art. In a particular embodiment, the electrochemical etching of the template is accomplished utilizing a 1:1 mixture of 49% hydrofluoric acid and ethanol. To control the morphology of the pores, including the length and the diameter, the etching may be performed utilizing a predetermined etching profile. This profile may be comprised of a plurality of variables, including, but not limited to the duration of the etching time and the etching current. Additionally, surfactants may be added to the mixture to further control the morphology of the nanopores. To provide a uniform contact for the electrochemical etching, a thin layer of conductive material, such as aluminum, chromium or gold, may be evaporated onto the back surface of the template.

The conductive material deposited into the through pores of the template to establish the nanowires may be selected from various conductive materials known in the art, including, but not limited to gold, nickel, iron, or a combination thereof.

It is within the scope of the present invention to utilize either a p-type doped silicon template or an n-type doped silicon template. Modification in the fabrication process for the nanowires is made dependent upon which type is selected. If a p-type silicon template is selected, the step of diffusion is accomplished utilizing an n-type dopant following the pattern of the substrate. Alternatively, if an n-type silicon template is selected, the step of diffusion is accomplished utilizing an p-type dopant consistent with the pattern of the substrate.

In a particular embodiment, the step of depositing and patterning a layer to protect the diffused regions entails depositing and patterning a layer of silicon nitride.

In addition to vertical interconnects for packaging, the present invention also provides for the use of functionalized nanowires as interconnects that are attached to transduction surfaces to establish MEMS sensors. In accordance with this embodiment, after the nanowires are exposed by backetching the template, the nanowires are then functionalized. In a particular embodiment, the nanowires are coated with gold prior to functionalization.

The nanowires may be functionalized utilizing several functionalization protocols. In an exemplary embodiment, functionalizing the nanowires includes applying direct adsorption of FITC-labeled streptavidin to the nanowire. In an alternative embodiment, functionalizing the nanowires involves depositing a SAM thioctic acid and subsequently binding FITC-labeled streptavidin. In yet another embodiment, functionalizing the nanowires requires immersing the nanowires in ECD-N-Hydroxysuccinimide-LS biotin solution and subsequently binding FITC-labeled streptavidin.

To establish the interconnection between the fabricated nanowires and a transduction surface, the exposed nanowires are eutectically bonded. Prior to being eutectically bonded, the nanowires may be coated on a tip portion with Au. The Au coated tip is then placed in contact with a receiving silicon wafer having transduction surfaces and appropriate heat and pressure are applied to establish the eutectic bond.

Accordingly, the present invention provides a high aspect ratio vertical through-wafer interconnect providing high density systems with reduced volume. In deployment as a sensor, the present invention connects the front side (sensor side) to the back side (package side) through tunable pores filled with metal surrounded by insulator. As such, the silicon dissolution technique in accordance with the present invention is a low cost, high volume manufacturing method when compared to DRIE (Deep Reactive Ion Etching).

Because shortened interconnects are always desirable to minimize line inductance, capacitance and cross-talk interferences, the ability to control the morphology of pores to provide uniformity of the trenches and flexibility in the design of 3-D interconnects, is critical. The present invention provides the ability to control the morphology of the silicon nanopores. Unlike previously reported research, this work presents a novel approach to fabrication that eliminates the need for an additional sacrificial layer.

A major impediment in using nanowires both in sensors and for nanoscale electronics has been the inability of researchers to develop a technique of assembling nanowires onto surfaces for transduction/electronics in a reliable/repeatable and cost effective way. The present invention provides a technique to integrate nanowires at desired locations in a reliable and repeatable manner.

Other aspects and advantages of the present invention can be seen upon review of the figures, the detailed description, and the claims, which follow.

BRIEF DESCRIPTION OF THE DRAWINGS

For a fuller understanding of the invention, reference should be made to the following detailed description, taken in connection with the accompanying drawings, in which.

DETAILED DESCRIPTION OF THE PREFERRED EMBODIMENT

The longstanding but heretofore unfulfilled need for an improved method for the fabrication of nanowires interconnects is now met by a new, useful, and nonobvious invention.

Figure 1:
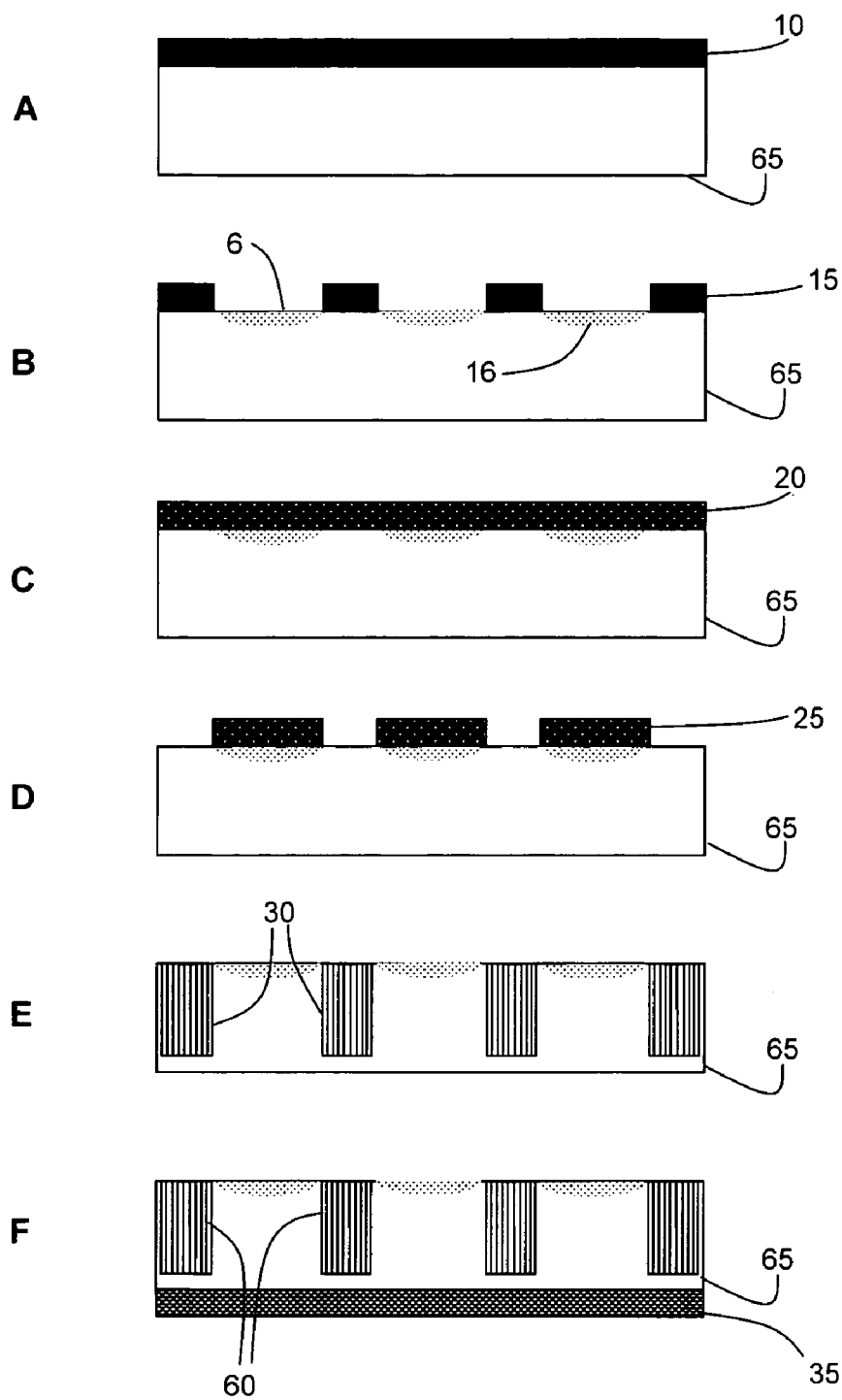
FIG. 1 is an illustration of the process flow for the fabrication of nanoporous silicon in accordance with the present invention.

With reference to FIG. 1, the present invention provides a novel method for synthesizing, functionalizing and attaching nanowires to transductors. In the exemplary embodiment as illustrated in FIG. 1, as shown in FIG. 1A, a silicon template 65 is oxidized 10 and patterned with a desired pattern 15 as shown in FIG. 1B. The silicon template 65 is either p-type or n-type. For a p-type silicon template 65, the surface 6 is then diffused with n-type material 16, following the desired pattern 15. A layer of silicon nitride 20 is then applied 20 as shown in FIG. 1C and patterned 25 to protect the diffused portions of the template as shown in FIG. 1D. The prepared template 65 is then subjected to electrochemical etching to establish pores 30 within the undiffused portions of the template 65 as shown in FIG. 1E.

After formation of the nanopores 30 within the silicon template 65, a Cr/Au seed layer 35 is deposited on the backside of the template 65 and the nanopores 30 are electroplated with the Cr/Au from the deposited seed layer 35 to establish the nanowires 60 in the silicon template 65 as shown with reference to FIG. 1F. Alternatively, other a metallic materials, such as, gold, nickel or chromium, or a combination thereof may be used as the seed layer 35 to electroplate the nanopores 30 and establish the nanowires 60 in the silicon template 65.

Figure 2:
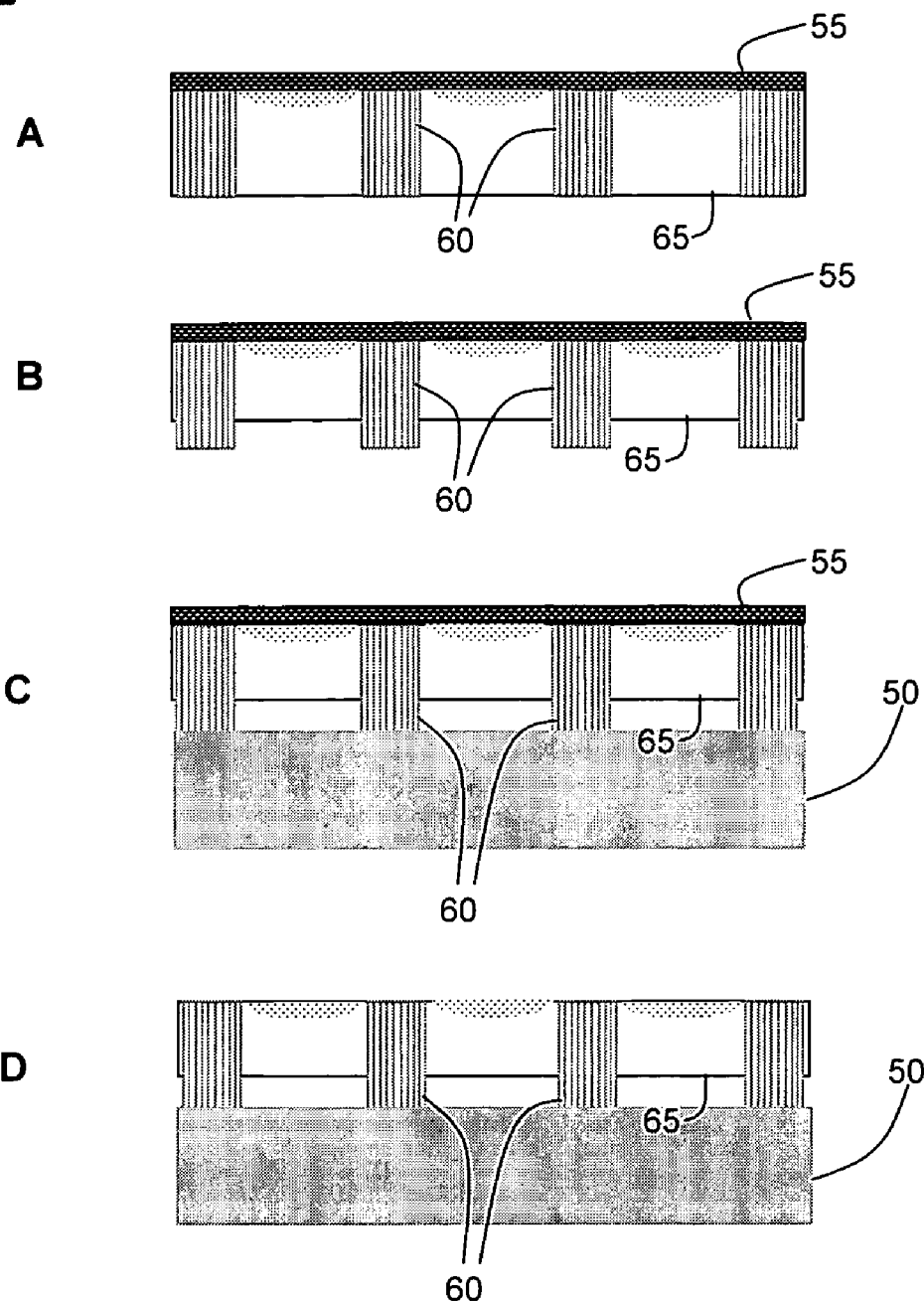
FIG. 2 is an illustration of the process flow for the fabrication of nanowires from nanoporous silicon in accordance with the present invention.

With reference to FIG. 2, to make the nanowires 60, as shown in FIG. 2A, available to establish interconnection between another silicon surfaces, the template 65 is back-etched to expose the nanowires 60, as shown in FIG. 2B. The exposed nanowires 60 are then placed in contact with specific locations on a silicon receiving element 50 and eutectic bonding is performed to establish the interconnections as shown in FIG. 2C. If the nanowires 60 were not originally fabricated in Au, the tips of the nanowires 60 would be coated in Au prior to the eutectic bonding to the receiving silicon 50. The top wafer 55 may then be polished to expose the nanowires 60 on the top of the silicon substrate as shown in FIG. 2D.

Figure 3:
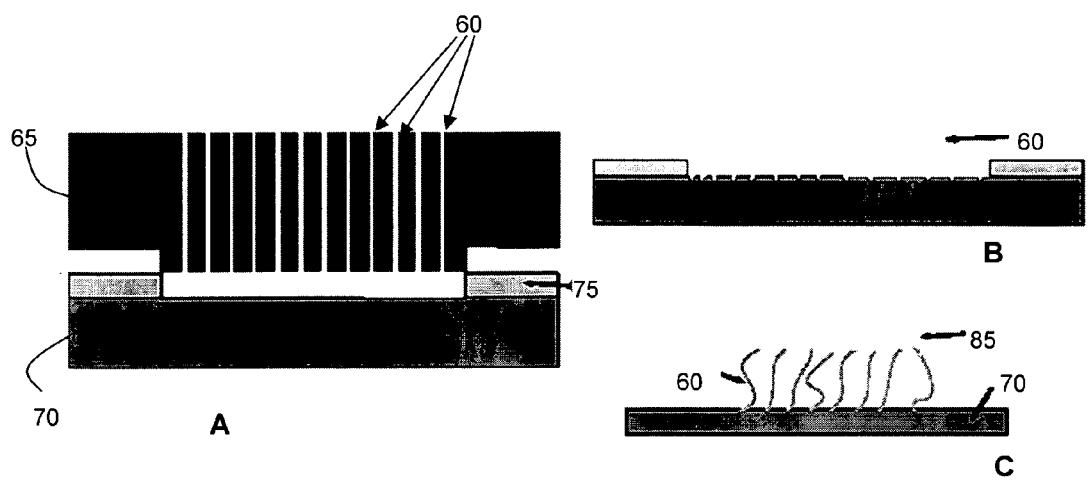
FIG. 3 is a detailed illustration of the vertical interconnect assembly in accordance with the present invention.
Figure 4:
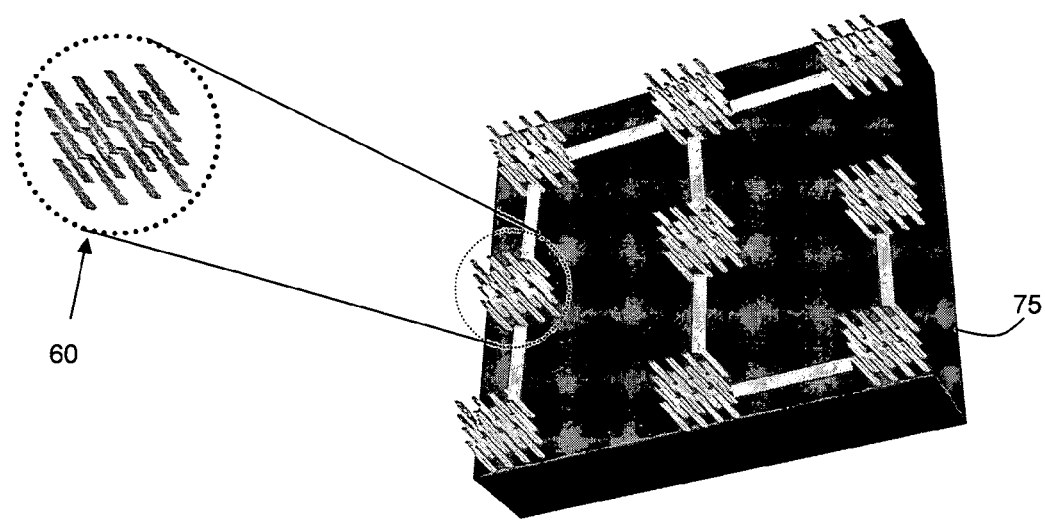
FIG. 4 is an illustration of an exemplary placement of nanowires on a receiving silicon substrate in accordance with the present invention.

FIG. 3 provides a detailed illustration of the fabricated nanowire interconnection process in accordance with the present invention. As shown, the fabricated Au nanowires 60 are imbedded in the silicon template 65. The exposed nanowires are placed in contact with a transduction and electronics plane 70 in a specific location identified by an oxide pattern 75, as shown in FIG. 3A. With reference to FIG. 3B, after selective removal of the silicon template 65, the localized Au nanowires 60 are exposed. As shown in FIG. 3C, additionally the nanowires 60 may be fabricated of Ni and Fe and be subsequently coated with Au tips 85 prior to the selective attachment to the electronics plane 70. FIG. 4 provides an illustration of an exemplary embodiment of how the nanowires 60 may be positioned on a silicon substrate 70 for use in a MEMS device.

Sensors based on metallic nanowires, nanorods and nanoparticle are increasingly being investigated because of unique electronic, optical, biological and magnetic sensing properties that these nanostructures offer. These properties aid in the development of reliable, improved and fast detection techniques for sensors. The present invention provides a method for the fabrication of nanowires and subsequent functionalization for use as sensors.

Figure 5:
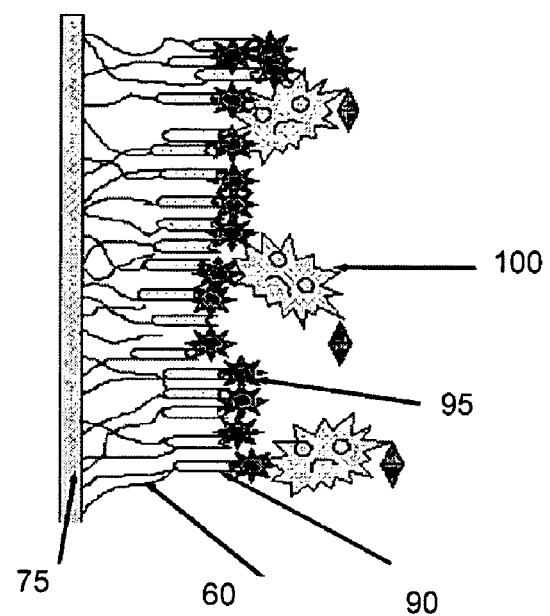
FIG. 5 is an illustration functionalization of the nanowires in accordance with the present invention.

In an exemplary embodiment, FIG. 5 illustrates a sensor utilizing the nanowire process in accordance with the present invention. As shown, the nanowires 60 are bonded to a transducer surface and then functionalized 90, in this case with streptavidin. In this particular embodiment, the nanowires were functionalized by covalently linking streptavidin to Au surfaces, using a thiol-based chemistry. The functionalized nanowires are then useful as sensors in the capture of antibodies 95 and identification of targets 100.

Figure 6:
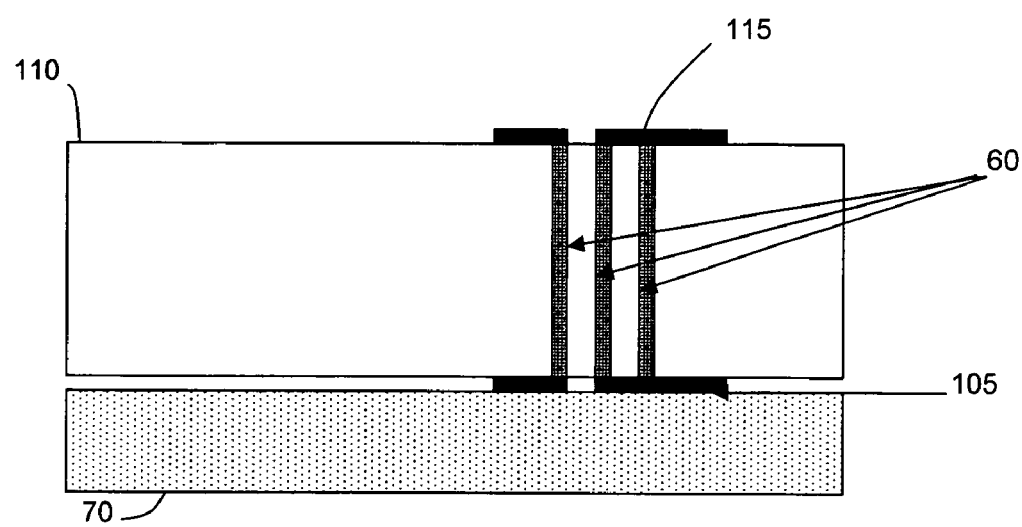
FIG. 6 is illustration of the functionalized nanowires employed as sensors in accordance with the present invention.

FIG. 6 illustrates an exemplary embodiment illustrating the interconnection between the front end sensor 110 and the signal processing plane 70. As shown, the nanowires 60 are use to establish a through-wafer interconnect between contact points 115 on the surface of the front end of the sensor 110 with contacts 105 on the signal processing plane 70.

In an exemplary embodiment of the process in accordance with the present invention and as outlined in FIG. 1, the nanoporous silicon was prepared by electrochemical etching of a silicon substrate. The starting material for the template was chosen based on the target pore diameter. N-type substrate (resistivity 0.4–0.6 ohm-cm) was used for target pore diameter of 290 nm and P-type substrate (resistivity 0.001–0.002 ohm-cm) was used for target pore diameter of 40 nm. On the backside of the wafer a thin layer of Al was evaporated to provide a uniform contact for electrochemical etching. Next the silicon wafer was mounted in a jig to ensure only the front side of the wafer was exposed to the etchant. The surfaces of Si substrate and Pt cathode were kept parallel to each other and the current flow in the etchant was normal to the wafer surface. The backside was then biased and the etchant, a mixture of 1:1 49% HF and ethanol, was added to the jig. The wafer was electrochemically etched at a constant current of 0.58 A, to obtain the nanopores. During etching of p-type wafers a potential of 5 V was applied and for n-type wafers a potential of 15V was applied. The length of the nanopores was controlled by changing the etching time. In this embodiment, an SEM micrograph of the n-type silicon substrate after etching for 100 minutes provided details of the process wherein the average pore diameter resulting in the substrate was 290 nm with a pitch of 1 µm. The pores were 145 µm deep. The length of the pores was controlled by controlling the etching time. When the etching time was increased from 100 minutes to 160 minutes, the pore depth increased from 145 to 235 µm, suggesting an average etch rate of 1.45 µm/min. The etch rate can be controlled by changing the etching current thereby changing the number of ions and hence the etch rate.

In an additional exemplary embodiment of the process flow for the selective formation of porous silicon, a p-type silicon wafer (0.00.1–0.004 ohm-cm) is initially oxidized. The front oxide is patterned with desired pattern and n-type dopant (Phosphorous, concentration ~1020 atoms/cm3) is diffused into Si. Next 3000 A of silicon nitride is then deposited and patterned to protect the diffused regions. The p-n junction and the nitride serve as protective layers in the electrochemical etching process. The process yields uniform pores of approximately 40–80 nm and 230 microns deep. The pores are formed in regions without the protective layer. In these regions, the p-n junction blocks the pore initiation and propagation due to lack of holes in the depletion region. Next the wafer is subjected to KOH etching for 30 sec which results in rapid dissolution of porous areas resulting in the desired structure.

One of the primary goals in the fabrication of the nanoporous surface is to obtain random high aspect ratio geometries at predefined locations, without corner compensation in (100) Si. To accomplish this, the present invention employs a strategy in which nanopores are formed selectively and then dissolved, resulting in structures of varying shapes. The depth of the structures is controlled by controlling etch time. Another interesting feature of this technique is the enhancement of the sidewall angle between <100> and <111> crystal planes (approximately 75°) as against 54.7 degrees obtained by conventional wet etching of silicon. The theory governing the etching of pores in silicon is the current burst model. The rate of adsorption of hydrogen is higher on the <111> plane compared to <100> planes there by resulting in anisotropic shapes. Addition of surfactants like Acetonitrile, Dimethylformamide (DMF) and Dimethylsulfoxide (DMSO) to the etching mixture results in uniform hydrogen adsorption rate thereby improving the sidewall angle. Unlike previously reported research, the present invention provides a novel approach to fabrication that eliminates the need for an additional sacrificial layer.

In an exemplary embodiment in accordance with the present invention in which the nanowires are employed as sensors, the specific functionalization protocols are as described. The Au surface of the nanowire is cleaned in a solution of hydrogen peroxide, ammonium hydroxide and DI water (1:1:3) at 80° C. for 10 minutes. It is then thoroughly washed in DI water and three different immobilization methods may be used to bind streptavidin on Au nanowires: (1) direct adsorption of FITC-labeled streptavidin on bare Au surface; (2) depositing a SAM of thioctic acid-(1-ethyl-3-[3-dimethylaminopropyl]carbodiimide hydrochloride) (EDC) and then binding FITC-labeled streptavidin; (3) immersion in EDC-N-Hydroxysuccinimide (NHS)-LS biotin solution and subsequently binding FITC-labeled streptavidin.

For depositing streptavidin on bare Au surface, a solution of 250 µg/mL FITC-labeled streptavidin (Sigma) in phosphate buffer was placed on the surface. According to a first immobilization method, the monolayers were incubated at 4° C. without appreciable loss of activity. For depositing SAM of thioctic acid-EDC, the Au surface was immersed into 2% (w/w) thioctic acid (ICN) in absolute ethanol with shaking. The surface was then rinsed in ethanol twice and dried. They were then immersed into 1% (w/w) EDC (Pierce Chemical) in anhydrous acetonitrile to activate the free carboxyl groups of thioctic acid. In accordance with a second immobilization method, the surface was rinsed twice in acetonitrile and exposed to FITC-labeled streptavidin. In the third immobilization method, using carboxyl-terminated chemistry, Au surface was activated with a solution of 0.2 M EDC and 0.05 M NHS-LS biotin in water. Then, 250 µg/mL of streptavidin was immobilized on the surface and incubated.

Two approaches are presented in accordance with the present invention to attach the fabricated nanowires in the desired locations. In the first approach, the electrodeposited nanowires are kept attached in the template matrix after plating. The desired length of the wires is exposed by etching the Si template, thus exposing the ends of the Au nanowire for SAM deposition. In the second approach, the functionalized wires with NiFe ends are magnetically handled and are attached to regions of interest. Unlike, conventional approaches that typically use epoxies or glues to attach the wires to sensor surface, coating both the wires and surfaces, this process keeps the wires clean. The present approach is expected to decrease the noise in sensing applications, as the entire surface of the nanowires is available for transduction. In the approach described herein, the length of the exposed nanowire can be effectively controlled by varying the etching time and nanowires remain attached to the transduction surface without surface contamination.

Figure 7:
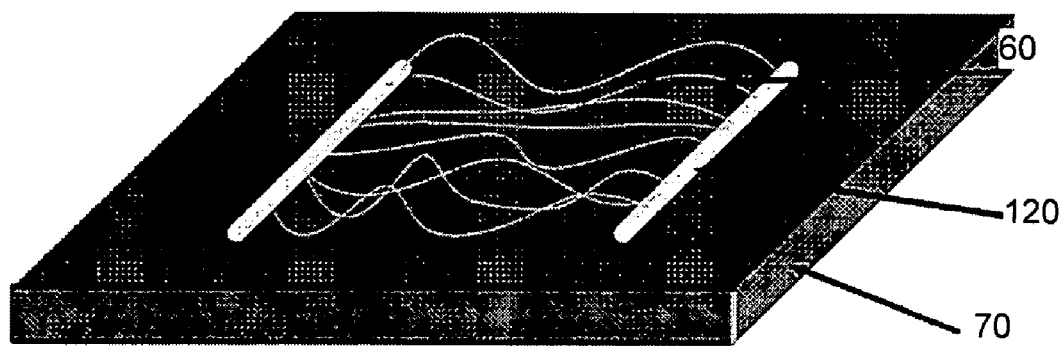
FIG. 7 is an illustration of the magnetic manipulation of the nanowires in accordance with the present invention.

The first approach of handling nanowires is as previously described, additionally a macro scale approach is also within the scope of the present invention. The macro scale approach allow for the magnetic manipulation of the multimaterial nanowires. As illustrated in FIG. 7, a permanent magnet or magnetic microelectrodes 120 are brought close to the substrate 70 with the plated NiFe/Au nanowires 60. It can be seen that the substrate responds to the magnetic fields and sticks to the surface.

It will be seen that the advantages set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween. Now that the invention has been described,

What is claimed is:

1. A method for the fabrication of nanowire interconnects, the method comprising the steps of:
    fabricating substantially vertical nanowires in a selectively passivated nanoporous silicon template;
    backetching the silicon template to expose the nanowires;
    eutectically bonding the exposed nanowires to a receiving silicon wafer; and
    etching the silicon template to produce nanowire interconnects in contact with the receiving silicon wafer.

2. The method of claim 1, wherein the step of fabricating substantially vertical nanowires in a selectively passivated nanoporous silicon template further comprises the steps of:
    providing a doped silicon template;
    oxidizing at least a portion of a front surface of the silicon template;
    patterning the front surface of the oxidized silicon template with a desired pattern;
    diffusing the silicon template with a dopant opposite to the dopant of the template, resulting in diffused regions and undiffused regions controlled by the desired pattern;
    depositing and patterning a layer to protect the diffused regions;
    electrochemically etching the template to fabricate substantially vertical nanopores in the undiffused regions of the silicon template;
    exposing the fabricated nanpores to an electrochemical etching to establish through-pores in the template;
    evaporating a thin layer of conductive material on a back surface of the silicon template to provide a uniform contact for etching; and
    depositing conductive material into the through pores of the template by electrochemical deposition to fabricate substantially vertical nanowires in the silicon template.

3. The method of claim 2, further comprising the step of applying critical point drying to the silicon template following the step of electrochemical etching.

4. The method of claim 2, wherein the step of electrochemically etching the silicon template further comprises electrochemically etching in a 1:1 mixture of 49% hydrofluoric acid and ethanol.

5. The method of claim 2, wherein the step of electrochemically etching the silicon template further comprises electrochemically etching based on a predetermined etching profile to control the length of the fabricated nanopores.

6. The method of claim 5, wherein the etching profile further comprises controlling the etching time and etching current during the electrochemical etching.

7. The method of claim 2, wherein the conductive material layer evaporated on the back surface of the template is aluminum.

8. The method of claim 2, wherein the conductive material layer evaporated on the back surface is comprised of chromium and gold.

9. The method of claim 2, wherein the conductive material deposited into the through pores of the template is gold.

10. The method of claim 2, wherein the conductive material deposited into the through pores of the template is comprised of nickel and iron.

11. The method of claim 2, wherein the doped silicon template is p-type and the step of diffusing the silicon template with a dopant further comprises diffusing the silicon template with an n-type dopant consistent with the pattern of the template.

12. The method of claim 2, wherein the doped silicon template is n-type and the step of diffusing the silicon template with a dopant further comprises diffusing the silicon template with a p-type dopant consistent with the pattern of the template.

13. The method of claim 2, wherein the step of depositing and patterning a layer to protect the diffused regions further comprises depositing and patterning a layer of silicon nitride.

14. The method of claim 2, further comprising the step of wet etching the silicon template to release the nanowires from the template.

15. The method of claim 1, further comprising the step of functionalizing the nanowires after the step of backetching to expose the nanowires.

16. The method of claim 15, wherein the step of functionalizing the nanowires further comprises the step of coating at least a portion of the nanowires with Au.

17. The method of claim 15, wherein the step of functionalizing the nanowires further comprises applying direct adsorption of FITC-labeled streptavidin to the nanowire.

18. The method of claim 15, wherein the step of functionalizing the nanowires further comprises depositing a SAM thioctic acid and subsequently binding FITC-labeled streptavidin.

19. The method of claim 15, wherein the step of functionalizing the nanowires further comprises immersing the nanowires in ECD-N-Hydroxysuccinimide-LS biotin solution and subsequently binding FITC-labeled streptavidin.

20. The method of claim 1, wherein the step of eutectically bonding the exposed nanowires to a receiving silicon wafer further comprises the steps of:

coating at least a tip portion of the exposed nanowires with Au;

placing the Au coated tip of the nanowires in contact with a receiving silicon wafer; and applying heat to establish a eutectic bond between at least one of the nanowires and the silicon surface.

21. The method of claim 20, wherein the step of placing the Au coated tip of the nanowires in contact with a receiving silicon wafer further comprising placing a permanent magnet is close proximity to the nanowires.

22. The method of claim 1, wherein the receiving silicon wafer further comprises receiving a silicon wafer having transduction surfaces.

23. The method of claim 2, wherein the step of electrochemically etching further comprises the step of adding surfactants.

24. A method of fabricating substantially vertical nanopores in a silicon template, the method comprising the steps of:

providing a doped silicon template;

oxidizing at least a portion of a front surface of the silicon template;

patterning the front surface of the oxidized silicon template with a desired pattern;

diffusing the silicon template with a dopant opposite to the dopant of the template, resulting in diffused regions and undiffused regions controlled by the desired pattern;

depositing and patterning a layer to protect the diffused regions; and electrochemically etching the template to fabricate substantially vertical nanopores in the undiffused regions of the silicon template.

25. The method of claim 24, wherein the doped silicon template is p-type and the step of diffusing the silicon template with a dopant further comprises diffusing the silicon template with an n-type dopant consistent with the pattern of the template.

26. The method of claim 24, wherein the doped silicon template is n-type and the step of diffusing the silicon template with a dopant further comprises diffusing the silicon template with a p-type dopant consistent with the pattern of the template.

* * * * *